(12) United States Patent
Sharaf et al.

(10) Patent No.: US 8,971,041 B2
(45) Date of Patent: Mar. 3, 2015

(54) COLDPLATE FOR USE WITH AN INVERTER IN AN ELECTRIC VEHICLE (EV) OR A HYBRID-ELECTRIC VEHICLE (HEV)

(75) Inventors: Nadir Sharaf, Bloomfield Township, MI (US); Slobodan Pavlovic, Novi, MI (US); Dilip Daftuar, West Bloomfield, MI (US); Juan Lopez, Royal Oak, MI (US)

(73) Assignee: Lear Corporation, Southfield, MI (US)

( * ) Notice: Subject to any disclaimer, the term of this patent is extended or adjusted under 35 U.S.C. 154(b) by 276 days.

(21) Appl. No.: 13/434,060

(22) Filed: Mar. 29, 2012

(65) Prior Publication Data

US 2013/0258596 A1    Oct. 3, 2013

(51) Int. Cl.
H05K 7/20    (2006.01)

(52) U.S. Cl.
CPC ................. H05K 7/20927 (2013.01)
USPC ............ 361/702; 361/698; 361/699; 363/141

(58) Field of Classification Search
USPC .................................................. 361/699–702
See application file for complete search history.

(56) References Cited

U.S. PATENT DOCUMENTS

| | | |
|---|---|---|
| 3,604,082 A | 9/1971 | McBrayer et al. |
| 3,622,846 A | 11/1971 | Reimers |
| 3,656,035 A | 4/1972 | Corman et al. |
| 4,628,407 A | 12/1986 | August et al. |
| 4,670,814 A | 6/1987 | Matsui et al. |
| 4,872,102 A | 10/1989 | Getter |
| 5,091,823 A | 2/1992 | Kanbara et al. |
| 5,239,443 A * | 8/1993 | Fahey et al. .................... 361/689 |
| 5,367,437 A | 11/1994 | Anderson |
| 5,408,209 A | 4/1995 | Tanzer et al. |
| 5,469,124 A | 11/1995 | O'Donnell et al. |
| 5,498,030 A | 3/1996 | Hill et al. |
| 5,504,655 A | 4/1996 | Underwood et al. |
| 5,634,262 A | 6/1997 | O'Donnell et al. |
| 5,740,015 A | 4/1998 | Donegan et al. |
| 5,749,597 A | 5/1998 | Saderholm |
| 5,940,263 A | 8/1999 | Jakoubovitch |
| 5,949,191 A | 9/1999 | Cassese et al. |
| 5,973,923 A | 10/1999 | Jitaru |
| 6,031,751 A | 2/2000 | Janko |
| 6,045,151 A | 4/2000 | Wu |

(Continued)

FOREIGN PATENT DOCUMENTS

| | | |
|---|---|---|
| CN | 2742712 | 11/2005 |
| CN | 101606210 | 12/2009 |

(Continued)

*Primary Examiner* — Zachary M Pape
(74) *Attorney, Agent, or Firm* — Brooks Kushman P.C.

(57) ABSTRACT

A coldplate for use with an inverter in an electric vehicle (EV) or a hybrid-electric vehicle (HEV). The inverter includes a direct current (DC) link capacitor comprising multiple film capacitors configured in a stack. The coldplate includes a first portion configured for attachment to at least one electronic component, the first portion having a perimeter and for dissipating heat generated by the electronic component. The coldplate includes a second portion oriented along the perimeter of the first portion and forming a conduit, the conduit having a chamber extending from the perimeter of the first portion and between two of the plurality of film capacitors of the DC link capacitor. The conduit has an inlet and an outlet to facilitate circulation of a coolant through the chamber of the conduit for dissipating heat generated by the DC link capacitor.

20 Claims, 5 Drawing Sheets

(56) References Cited

U.S. PATENT DOCUMENTS

| | | | |
|---|---|---|---|
| 6,087,916 A | 7/2000 | Kutkut et al. | |
| 6,144,276 A | 11/2000 | Booth | |
| 6,201,701 B1 | 3/2001 | Linden et al. | |
| 6,206,466 B1 | 3/2001 | Komatsu | |
| 6,222,733 B1 | 4/2001 | Gammenthaler | |
| 6,262,891 B1 * | 7/2001 | Wickelmaier et al. | 361/695 |
| 6,313,991 B1 | 11/2001 | Nagashima et al. | |
| 6,326,761 B1 * | 12/2001 | Tareilus | 318/722 |
| 6,386,577 B1 | 5/2002 | Kan et al. | |
| 6,430,024 B1 | 8/2002 | Gernert | |
| 6,450,528 B1 | 9/2002 | Suezawa et al. | |
| 6,466,441 B1 | 10/2002 | Suzuki | |
| 6,529,394 B1 | 3/2003 | Joseph et al. | |
| 6,819,561 B2 | 11/2004 | Hartzell et al. | |
| 6,839,240 B2 | 1/2005 | Skofljanec et al. | |
| 6,844,802 B2 | 1/2005 | Drummond et al. | |
| 6,943,293 B1 | 9/2005 | Jeter et al. | |
| 7,050,305 B2 | 5/2006 | Thorum | |
| 7,109,681 B2 | 9/2006 | Baker et al. | |
| 7,130,197 B2 | 10/2006 | Chin | |
| 7,164,584 B2 | 1/2007 | Walz | |
| 7,173,823 B1 * | 2/2007 | Rinehart et al. | 361/699 |
| 7,204,299 B2 | 4/2007 | Bhatti et al. | |
| 7,212,407 B2 | 5/2007 | Beihoff et al. | |
| 7,236,368 B2 | 6/2007 | Maxwell et al. | |
| 7,264,045 B2 | 9/2007 | Mehendale et al. | |
| 7,289,329 B2 | 10/2007 | Chen et al. | |
| 7,295,448 B2 | 11/2007 | Zhu | |
| 7,375,287 B2 | 5/2008 | Rathmann | |
| 7,375,974 B2 | 5/2008 | Kirigaya | |
| 7,471,534 B2 | 12/2008 | Andersson et al. | |
| 7,479,020 B2 | 1/2009 | Whitton | |
| 7,554,817 B2 | 6/2009 | Nakakita et al. | |
| 7,579,805 B2 * | 8/2009 | Saito et al. | 318/800 |
| 7,646,606 B2 * | 1/2010 | Rytka et al. | 361/704 |
| 7,660,099 B2 | 2/2010 | Imamura et al. | |
| 7,710,723 B2 * | 5/2010 | Korich et al. | 361/699 |
| 7,726,440 B2 | 6/2010 | Aisenbrey | |
| 7,742,303 B2 | 6/2010 | Azuma et al. | |
| 7,788,801 B2 | 9/2010 | Oggioni et al. | |
| 7,791,887 B2 | 9/2010 | Ganev et al. | |
| 7,798,833 B2 | 9/2010 | Holbrook | |
| 7,800,257 B2 | 9/2010 | Lu | |
| 7,804,688 B2 | 9/2010 | Wakabayashi et al. | |
| 7,864,506 B2 | 1/2011 | Pal et al. | |
| 7,869,714 B2 * | 1/2011 | Patel et al. | 398/118 |
| 7,907,385 B2 | 3/2011 | Korich et al. | |
| 7,920,039 B2 | 4/2011 | Shabany et al. | |
| 7,952,225 B2 | 5/2011 | Reichard et al. | |
| 7,952,876 B2 | 5/2011 | Azuma et al. | |
| 7,957,166 B2 * | 6/2011 | Schnetzka et al. | 363/56.03 |
| 7,974,101 B2 | 7/2011 | Azuma et al. | |
| 8,040,005 B2 | 10/2011 | Bhatti | |
| 8,064,198 B2 * | 11/2011 | Higashidani et al. | 361/679.53 |
| 8,064,234 B2 * | 11/2011 | Tokuyama et al. | 363/141 |
| 8,072,758 B2 | 12/2011 | Groppo et al. | |
| 8,098,479 B1 | 1/2012 | Parler, Jr. et al. | |
| 8,110,415 B2 * | 2/2012 | Knickerbocker et al. | 438/15 |
| 8,169,780 B2 * | 5/2012 | Yoshino et al. | 361/699 |
| 8,376,069 B2 * | 2/2013 | Nakatsu et al. | 180/65.21 |
| 8,416,574 B2 * | 4/2013 | Tokuyama et al. | 361/699 |
| 8,422,230 B2 | 4/2013 | Aiba et al. | |
| 8,582,291 B2 * | 11/2013 | Nakasaka et al. | 361/679.47 |
| 8,582,294 B2 | 11/2013 | Guerin et al. | |
| 8,654,527 B2 * | 2/2014 | Wei et al. | 361/688 |
| 8,665,596 B2 | 3/2014 | Brereton | |
| 8,675,364 B2 * | 3/2014 | Tokuyama et al. | 361/715 |
| 2002/0106414 A1 | 8/2002 | Gernert | |
| 2002/0130495 A1 | 9/2002 | Lotspih et al. | |
| 2003/0053298 A1 | 3/2003 | Yamada et al. | |
| 2005/0263273 A1 | 12/2005 | Crumly | |
| 2007/0240867 A1 | 10/2007 | Amano et al. | |
| 2007/0246191 A1 | 10/2007 | Behrens et al. | |
| 2008/0117602 A1 | 5/2008 | Korich et al. | |
| 2010/0078807 A1 | 4/2010 | Schulz | |
| 2010/0081191 A1 | 4/2010 | Woods | |
| 2010/0157640 A1 | 6/2010 | Azuma et al. | |
| 2010/0254093 A1 | 10/2010 | Oota et al. | |
| 2010/0328883 A1 | 12/2010 | Ledezma et al. | |
| 2010/0328893 A1 | 12/2010 | Higashidani et al. | |
| 2011/0116235 A1 | 5/2011 | Ryu et al. | |
| 2011/0214629 A1 | 9/2011 | Benoit | |
| 2011/0222240 A1 | 9/2011 | Kawata et al. | |
| 2011/0235276 A1 | 9/2011 | Hentschel et al. | |
| 2011/0267778 A1 | 11/2011 | Eckstein et al. | |
| 2012/0031598 A1 | 2/2012 | Han et al. | |
| 2012/0206950 A1 | 8/2012 | Duppong et al. | |
| 2012/0235290 A1 | 9/2012 | Morelle et al. | |
| 2013/0039009 A1 * | 2/2013 | Shin et al. | 361/699 |
| 2013/0044434 A1 * | 2/2013 | Sharaf et al. | 361/702 |
| 2013/0170269 A1 | 7/2013 | Sharaf et al. | |
| 2013/0215573 A1 * | 8/2013 | Wagner et al. | 361/702 |
| 2013/0223009 A1 | 8/2013 | Nakatsu et al. | |
| 2013/0258596 A1 | 10/2013 | Sharaf et al. | |
| 2014/0069615 A1 | 3/2014 | Kusaka | |

FOREIGN PATENT DOCUMENTS

| | | |
|---|---|---|
| CN | 101981638 | 2/2011 |
| CN | 102013319 | 4/2011 |
| CN | 102013319 A | 4/2011 |
| DE | 102007054618 A1 | 6/2008 |
| DE | 102008033473 A1 | 5/2009 |
| EP | 1028439 | 8/2000 |
| EP | 1028439 A1 | 8/2000 |
| EP | 1484774 | 12/2004 |
| FR | 2903057 | 1/2008 |
| FR | 2903057 A1 | 1/2008 |
| JP | 4256397 | 9/1992 |
| JP | 07297043 | 11/1995 |
| JP | 2004254358 A | 9/2004 |
| JP | 2007219882 A | 8/2007 |
| JP | 2007273774 | 10/2007 |
| JP | 2007273774 A | 10/2007 |
| JP | 2008078350 | 4/2008 |
| JP | 2008078350 A | 4/2008 |
| JP | 2008085168 | 4/2008 |
| JP | 2011182500 | 9/2011 |
| WO | 2010/144399 | 12/2010 |
| WO | 2010144399 | 12/2010 |
| WO | 2011/138156 | 11/2011 |
| WO | 2011138156 | 11/2011 |
| WO | 2011138156 A1 | 11/2011 |

* cited by examiner

COLDPLATE FOR USE WITH AN INVERTER IN AN ELECTRIC VEHICLE (EV) OR A HYBRID-ELECTRIC VEHICLE (HEV)

TECHNICAL FIELD

The following relates to a coldplate for use with an inverter in an electric vehicle (EV) or a hybrid-electric vehicle (HEV).

BACKGROUND

Automotive vehicles powered by an electric motor or an electric motor and a gasoline engine are commonly referred to as electric vehicles (EV) or hybrid-electric vehicles (HEV). As is well known in the art, such vehicles include batteries for supplying power to the electric motors thereof. Electric and hybrid-electric vehicles typically provide for charging such batteries using an interface configured to rectify electrical power from a 120 volt or 240 volt alternating current (AC) utility power line for storage by the vehicle batteries.

Electric and hybrid-electric vehicles also include an inverter for use in converting the direct current (DC) voltage provided by the vehicle batteries to an AC voltage for use in powering the electric motor or motors of the vehicle. Such an inverter may comprise switching modules, such as integrated gate bipolar transistor (IGBT) modules, and a DC link capacitor, which itself may comprise a plurality of film capacitors.

In converting an input DC voltage to an AC voltage output, the film capacitors of the DC link capacitor generate heat as a result of the switching operations of the IGBT power modules. The heat generated as a result of such operations should be dissipated so that the inverter may continue to operate efficiently. Such heat generated by the operation of the IGBT power modules and the DC link capacitor may be dissipated using a coldplate provided as part of the inverter.

In that regard, an exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 7,864,506 entitled "System And Method Of Film Capacitor Cooling," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

However, due to the heat generated as a result of the operation of an inverter used in an EV or HEV, there exists a need for additional heat dissipation beyond that which may be provided by standard coldplates currently in use with an EV or HEV inverter. Such a coldplate would include a portion having a chamber configured to contact one or more of the film capacitors of the DC link capacitor in order to provide for additional dissipation of the heat generated by inverter operation.

SUMMARY

According to one embodiment disclosed herein, a coldplate is provided for use with an inverter in an electric vehicle (EV) or a hybrid-electric vehicle (HEV). The inverter includes a direct current (DC) link capacitor comprising a plurality of film capacitors configured in a stack. The coldplate comprises a first portion configured for attachment to at least one electronic component. The first portion has a perimeter and is for dissipating heat generated by the at least one electronic component.

The coldplate further comprises a second portion oriented along the perimeter of the first portion and forming a conduit, the conduit having a chamber extending from the perimeter of the first portion and between two of the plurality of film capacitors of the DC link capacitor. The conduit has an inlet and an outlet to facilitate circulation of a coolant through the chamber of the conduit for dissipating heat generated by the DC link capacitor.

According to another embodiment disclosed herein, a heat sink is provided for use with an inverter in an EV or an HEV. The inverter includes a DC link capacitor comprising a plurality of film capacitors configured in a stack to form a substantially polygonal prism. The heat sink comprises a first portion configured for attachment to a printed circuit board (PCB) having at least one electronic component attached thereto. The first portion has a perimeter and is for dissipating heat generated by the at least one electronic component.

In this embodiment, the heat sink further comprises a second portion oriented along the perimeter of the first portion and forming a conduit. The conduit has a plurality of chambers extending from the perimeter of the first portion and between two of the plurality of film capacitors of the DC link capacitor. The conduit has an inlet and an outlet to facilitate circulation of a coolant through the plurality of chambers of the conduit for dissipating heat generated by the DC link capacitor.

According to a further embodiment disclosed herein, an inverter is provided for use in an EV or an HEV. The inverter comprises a direct current DC link capacitor comprising a plurality of film capacitors configured in a stack to form a substantially polygonal prism, and a heat sink.

The heat sink comprises a first portion configured for attachment to at least one electronic component. The first portion has a perimeter and is for dissipating heat generated by the at least one electronic component.

The heat sink further comprise a second portion oriented along the perimeter of the first portion and forming a conduit. The conduit has a chamber extending from the perimeter of the first portion and between two of the plurality of film capacitors of the DC link capacitor. The conduit has an inlet and an outlet to facilitate circulation of a coolant through the chamber of the conduit for dissipating heat generated by the DC link capacitor.

A detailed description of these embodiments of an inverter for use in an EV or an HEV, including embodiments of a coldplate for use with an inverter, are set forth below together with accompanying drawings.

DETAILED DESCRIPTION

Figure 1A:
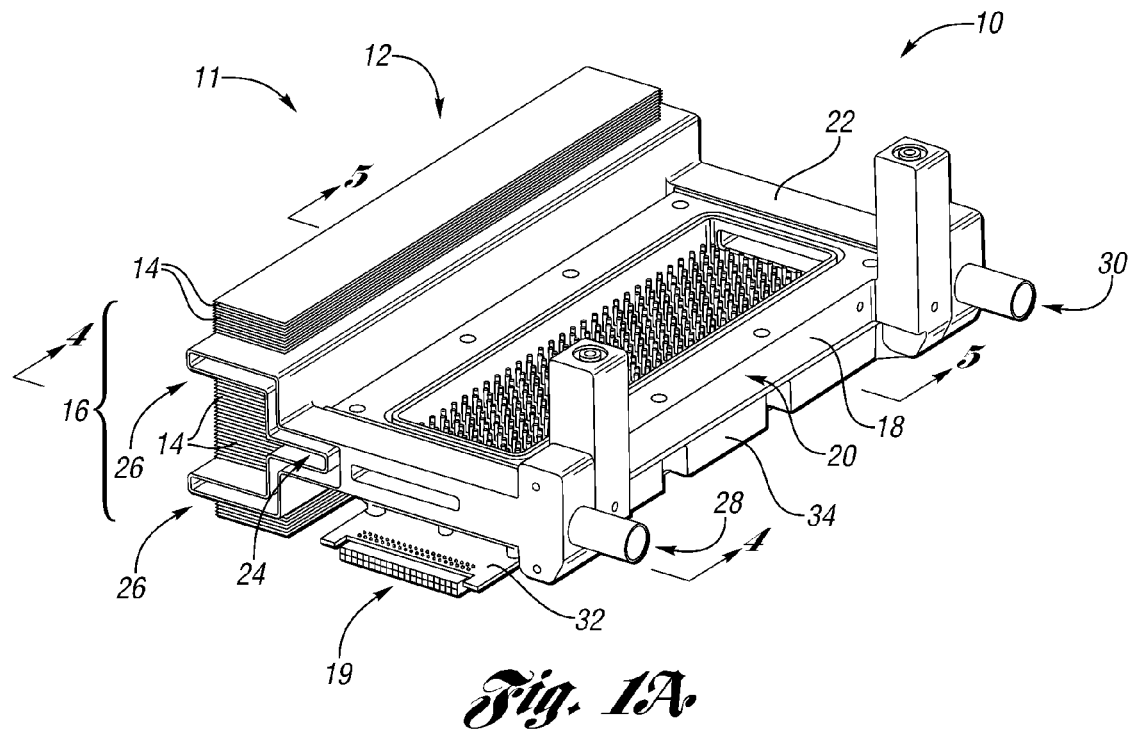
FIGS. 1A and 1B are perspective views of a coldplate for use in an electric vehicle (EV) or a hybrid-electric vehicle (HEV), together with a Direct Current (DC) link capacitor with multiple film capacitors, as disclosed herein.

With reference to FIGS. 1-5, a more detailed description of embodiments of a coldplate for use in an electric vehicle (EV) or a hybrid-electric vehicle (HEV) will be described. For ease of illustration and to facilitate understanding, like reference numerals have been used herein for like components and features throughout the drawings.

As noted above, electric and hybrid-electric vehicles include an inverter for use in converting the direct current (DC) voltage stored and provided by the vehicle batteries to an AC voltage for use in powering the electric motor or motors of the vehicle. Such an inverter may comprise IGBT switching modules and a DC link capacitor, which itself may comprise a plurality of film capacitors.

In converting an input DC voltage to a AC voltage output, the film capacitors of the DC link capacitor generate heat as a result of the switching operations of the IGBT power modules. The heat generated as a result of such operations should be dissipated, such as through a coldplate, so that the inverter may continue to operate efficiently.

An exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 7,864,506 entitled "System And Method Of Film Capacitor Cooling," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

There exists, however, a need for additional heat dissipation, extraction or removal beyond that which may be provided by standard coldplates currently in use with an EV or HEV inverter. Such a coldplate would include a portion having a chamber configured to contact one or more of the film capacitors of the DC link capacitor in order to provide for additional extraction, removal or dissipation of the heat generated by inverter operation.

Figure 1B:
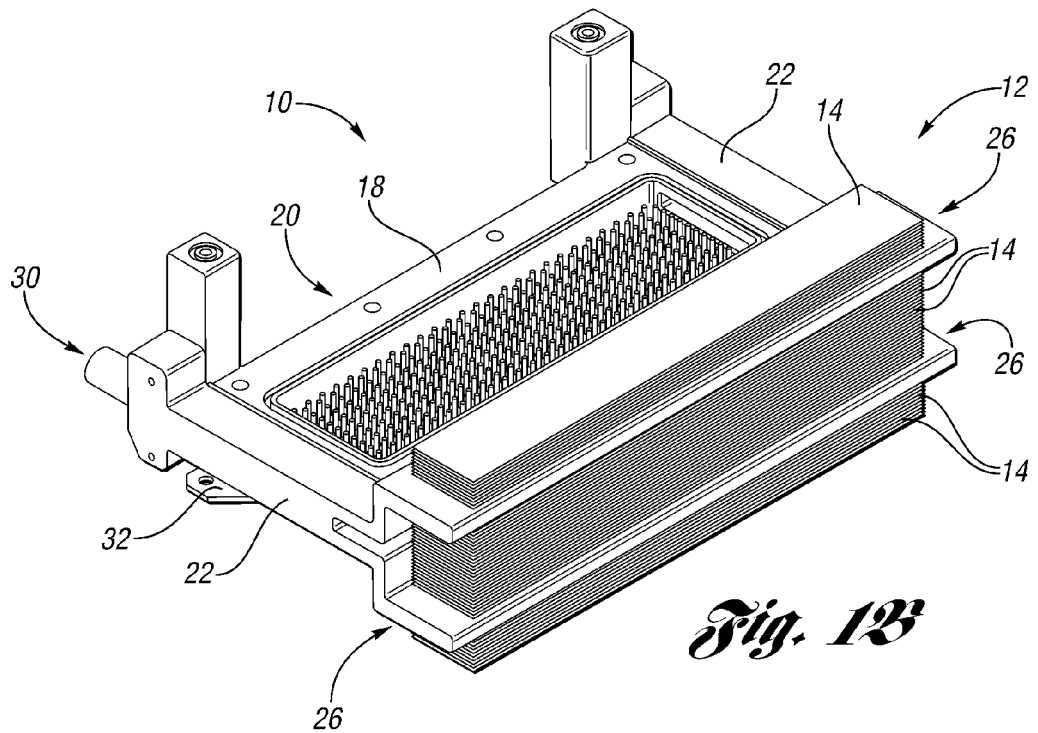

Referring now to FIGS. 1A and 1B, perspective views are shown of a coldplate (10) for use with an inverter in an EV or an HEV. The inverter, denoted generally by reference numeral (11), may include a DC link capacitor (12) comprising a plurality of film capacitors (14) configured in a stack (16). As seen in FIGS. 1A and 1B, the stack (16) of film capacitors (14) may form a substantially rectangular prism, although other polygonal prism shapes may be employed.

The coldplate (10) may comprise a first portion (18) having top and bottom sides and configured for attachment to at least one electronic component (19). As shown in FIGS. 1A and 1B, the at least one electronic component (19) may be a printed circuit board (PCB) (32) and/or an integrated gate bipolar transistor (IGBT) power module (34) attached directly or indirectly to the bottom side of the first portion (18) of the coldplate (10). The PCB (32) may itself have at least one electronic component attached thereto. As is well known in the art, IBGT power module (34) and DC link capacitor (12) are provided in electrical communication (see FIGS. 3A-3C) and are for use in converting a DC voltage input from vehicle batteries (not shown) to an AC output voltage for powering an electric motor (not shown) of the vehicle.

The coldplate (10), which acts as and may also be referred to as a heat extractor or heat sink, is provided for extracting, removing or dissipating heat generated by the at least one electronic component (19), such as the PCB (32) having attached electronic components and/or the IGBT power module (34). As seen in FIGS. 1A and 1B, the first portion (18) of coldplate (10) may have a substantially ring-like shape with a perimeter (20). Alternatively, first portion (18) may be provided with a substantially plate-like shape, still having a perimeter (20).

The coldplate (10) may further comprise a second portion (22) oriented along the perimeter (20) of the first portion (18). As seen in FIGS. 1A and 1B, the perimeter (20) of the first portion (18) of the coldplate (10) may comprise four sides, and the second portion (22) of the coldplate (10) may extend along three sides of the perimeter (20) of the first portion (18) of the coldplate (10).

The second portion (22) of the coldplate (10) may form a conduit (24). In that regard, a side of the second portion (22) of the coldplate (10) is cut away in FIG. 1A in order to expose a portion of the conduit (24). The conduit (24) may have one or more chambers (26) extending from the perimeter (20) of the first portion (18) and between two of the plurality of film capacitors (14) of the DC link capacitor (12). The conduit (24) may have an inlet (28) and an outlet (30) to facilitate circulation of a coolant through the chambers (26) of the conduit (24) for dissipating heat generated by the DC link capacitor (12).

Figure 2A:
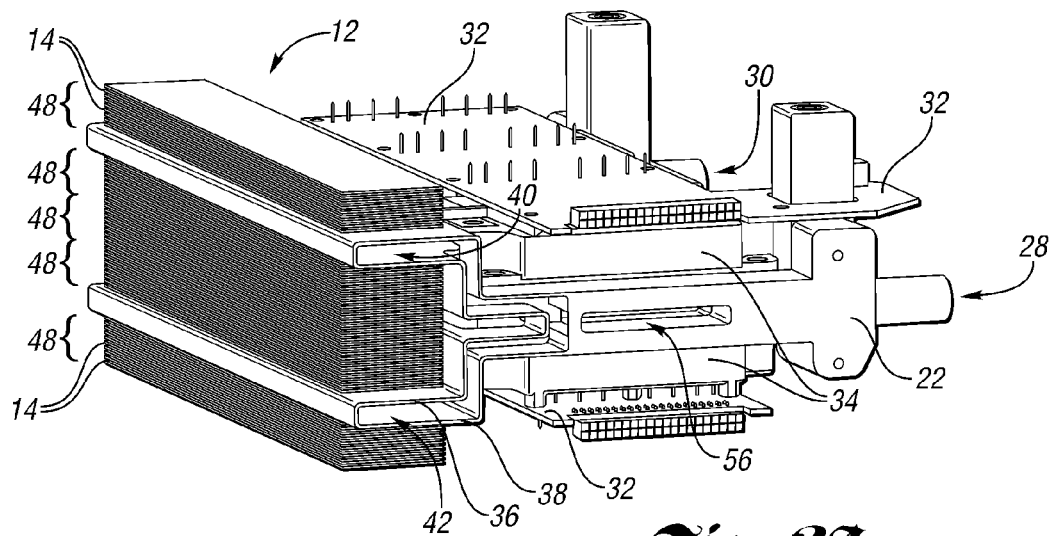
FIGS. 2A and 2B are perspective views of the coldplate for use in an electric vehicle (EV) or a hybrid-electric vehicle (HEV), together with a DC link capacitor with multiple film capacitors, an electronic component, and printed circuit board, as disclosed herein.
Figure 2B:
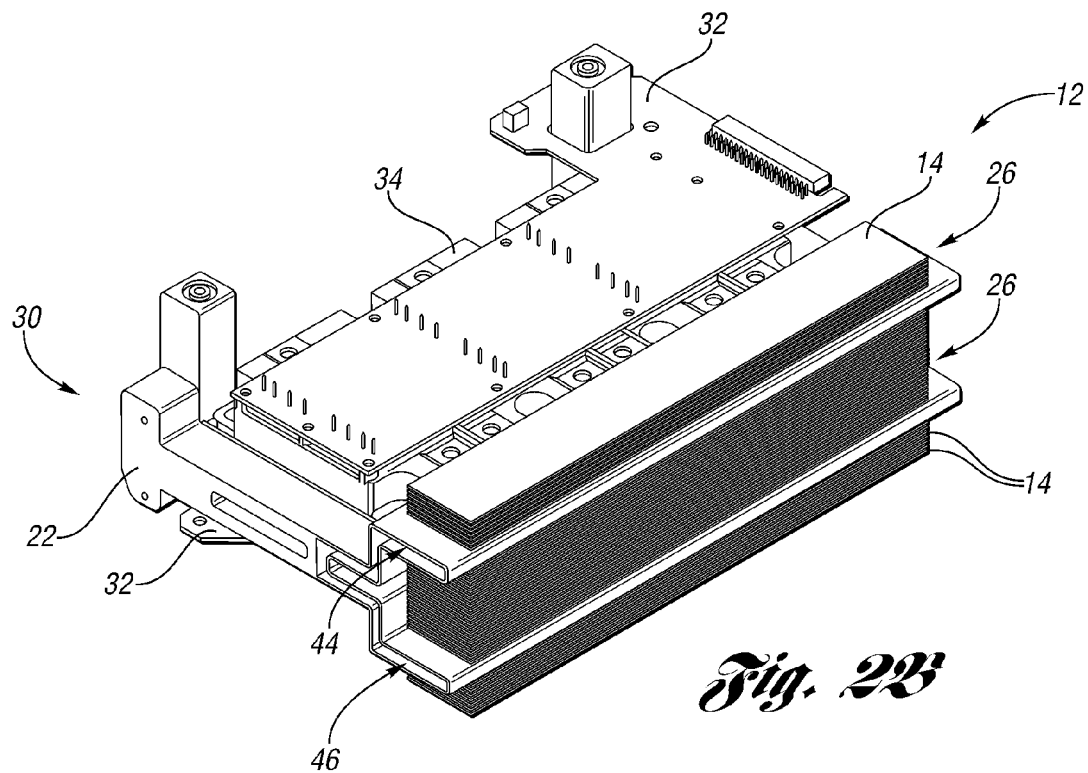

Referring now to FIGS. 2A and 2B, perspective views of a coldplate (10) for use in an EV or an HEV, together with a DC link capacitor (12) with multiple film capacitors (14), together with multiple PCBs (32) and IGBTs (34). As can be seen therein, and with continuing reference to FIGS. 1A and 1B, a PCB (32) and IGBT (34) are connected, directly or indirectly, to the top and bottom sides of coldplate (10).

As also seen in FIGS. 2A and 2B, each chamber (26) of the second portion (22) of the coldplate (10) may be formed in part by a pair of substantially planar opposed walls (36, 38), and the chamber (26) may as a result have a substantially plate-like shape. As in FIG. 1A, a side of the second portion (22) of the coldplate (10) is cut away in FIGS. 2A and 2B in order to expose a portion of the conduit (24) and the chambers (26). Each substantially planar wall (36, 38) of each chamber (26) has an area configured for contact with a side of one of the plurality of film capacitors (14) of the DC link capacitor (12).

As is readily apparent, coolant may flow and/or circulate from inlet (28) through the conduit (24) formed by the second portion (22) of the coldplate (10), including through inlets (40, 42) into chambers (26), then out of chambers (26) through outlets (44, 46) and on to outlet (30). Such a configuration and coolant flow facilitates the dissipation of heat generated by the film capacitors (14) of DC link capacitor (12).

It should be noted that, as used herein, the term film capacitor refers to one of the plurality of film capacitors (14) that comprise the DC link capacitor (12). It should also be noted that the plurality of film capacitors (14) of the DC link capacitor (12) may comprise a plurality of packs (48) of film capacitors (14). In that event, the chambers (26) of the second portion (22) of the coldplate (10) may extend between two of the plurality of packs (48) of film capacitors (14). As well, each substantially planar wall (36, 38) of the chambers (26) has an area configured for contact with a side of a film capacitor (14) in a different one of the plurality of packs (48) of film capacitors (14).

Figure 3A:
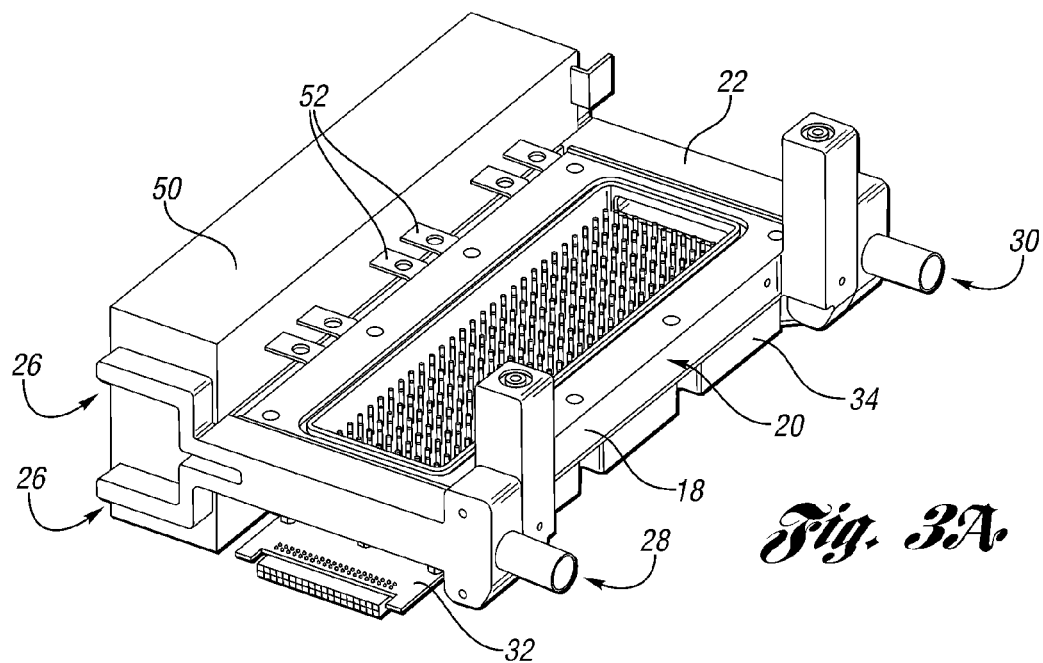
FIGS. 3A-3D are perspective views of the coldplate for use in an electric vehicle (EV) or a hybrid-electric vehicle (HEV), together with a DC link capacitor with multiple film capacitors, an electronic component, printed circuit board, and a capacitor housing, as disclosed herein.
Figure 3B:
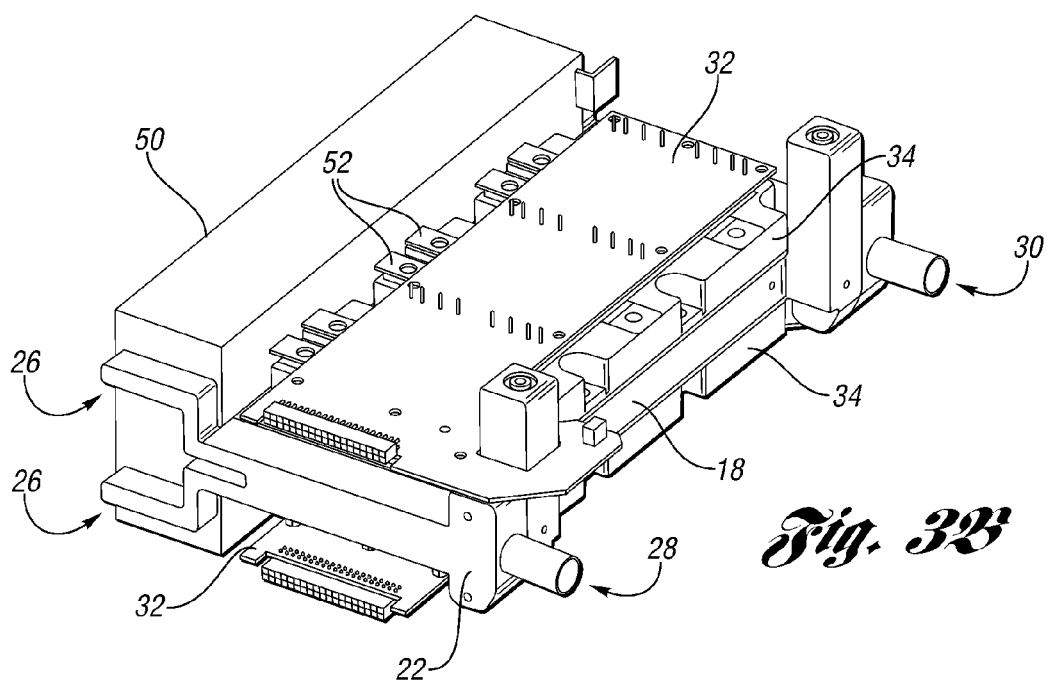

Referring next to FIGS. 3A-3D, perspective views are shown of the coldplate (10) for use in an EV or an HEV, together with a DC link capacitor (12) with multiple film capacitors (14), an electronic component (19), such as one or more IGBTs (34) and PCBs (32), and a capacitor housing (50). In particular, FIG. 3A shows an IGBT power module (34) and PCB (32) attached to the bottom side of the first portion (18) of the coldplate (10). As seen in FIG. 3B, an additional IGBT module (34) and PCB (32) are attached to the top side of the first portion (18) of the coldplate (10).

Figure 3C:
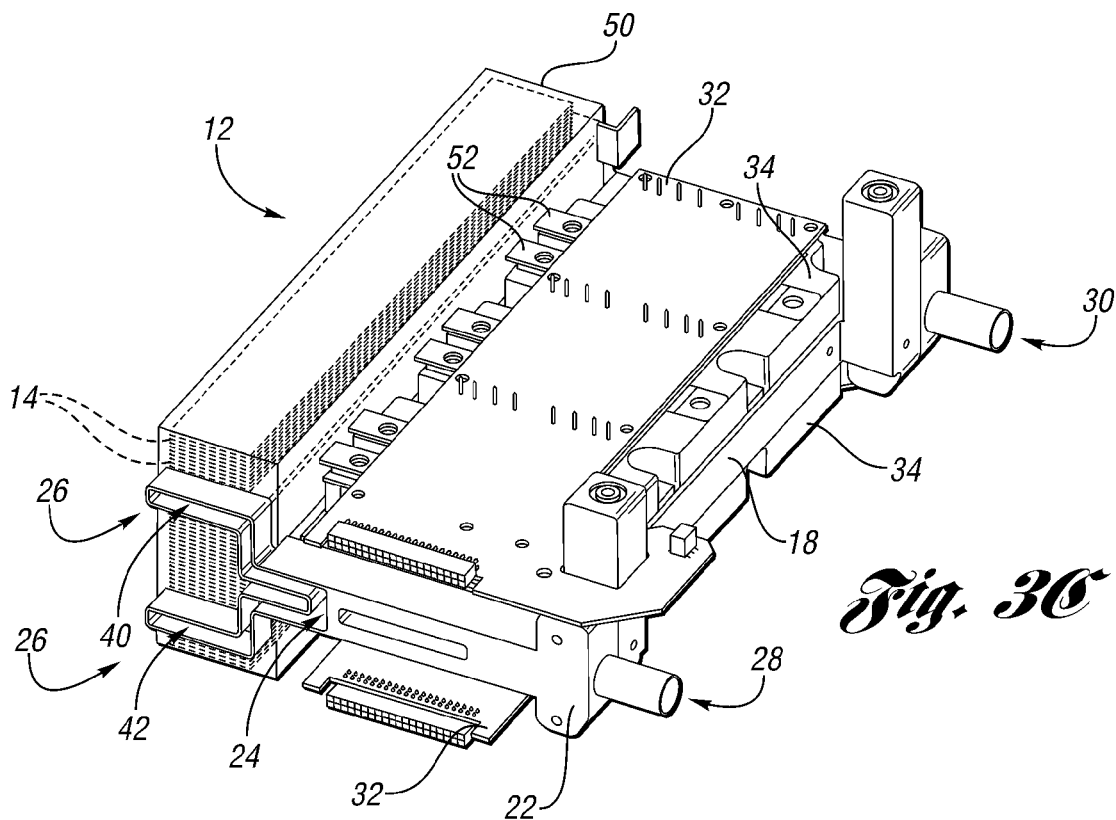
Figure 3D:
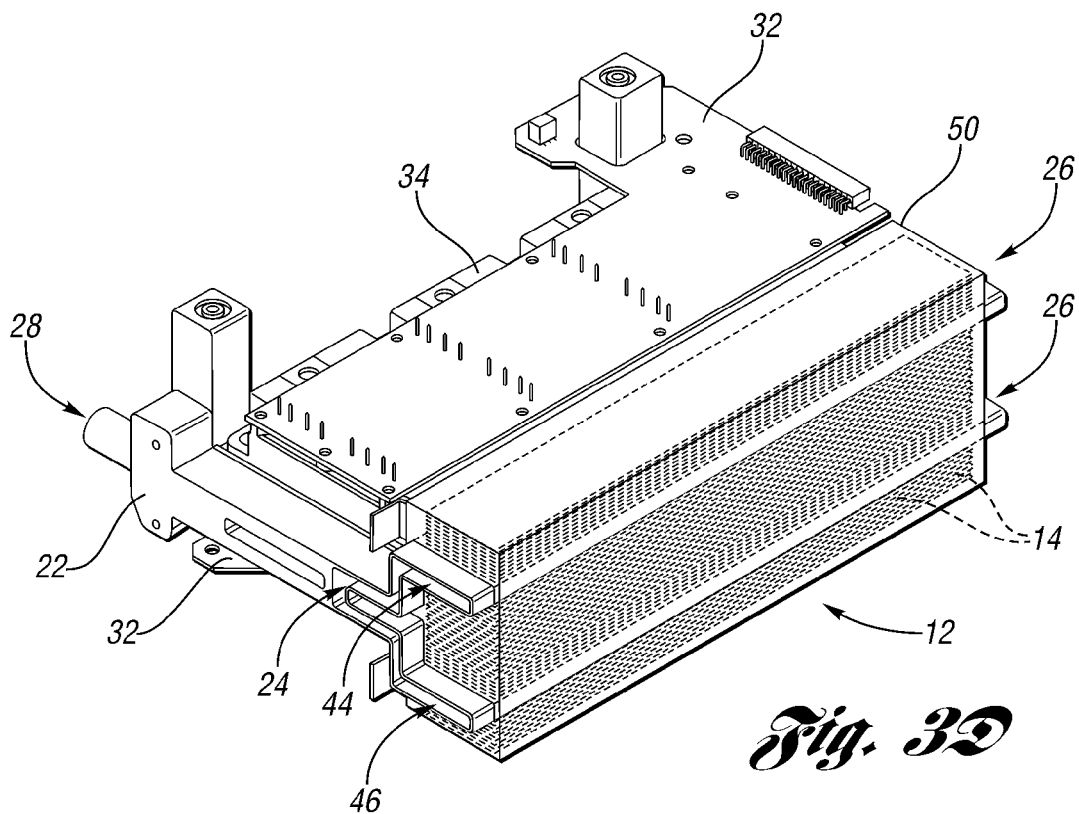

In FIGS. 3C and 3D, the capacitor housing (50) is rendered transparent in order to show the DC link capacitor (12) and multiple film capacitors (14) therein. As seen in FIGS. 3A-3C, multiple terminals (52) may be provided to establish an electrical connection between the DC link capacitor (12) and the IGBT modules (34).

Figure 4:
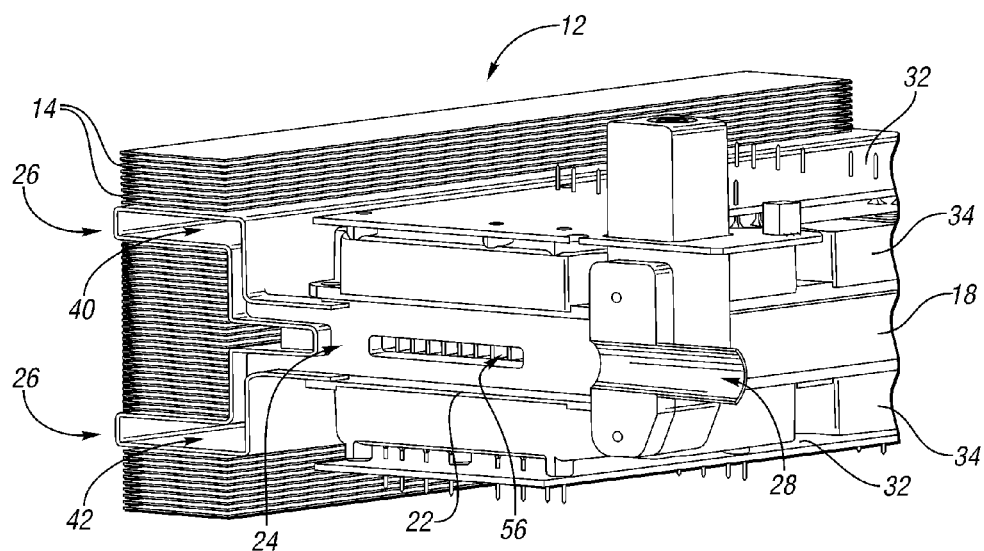
FIG. 4 is a cross-sectional view of the coldplate of FIG. 1A disclosed herein taken along the line 4-4 in FIG. 1A.
Figure 5:
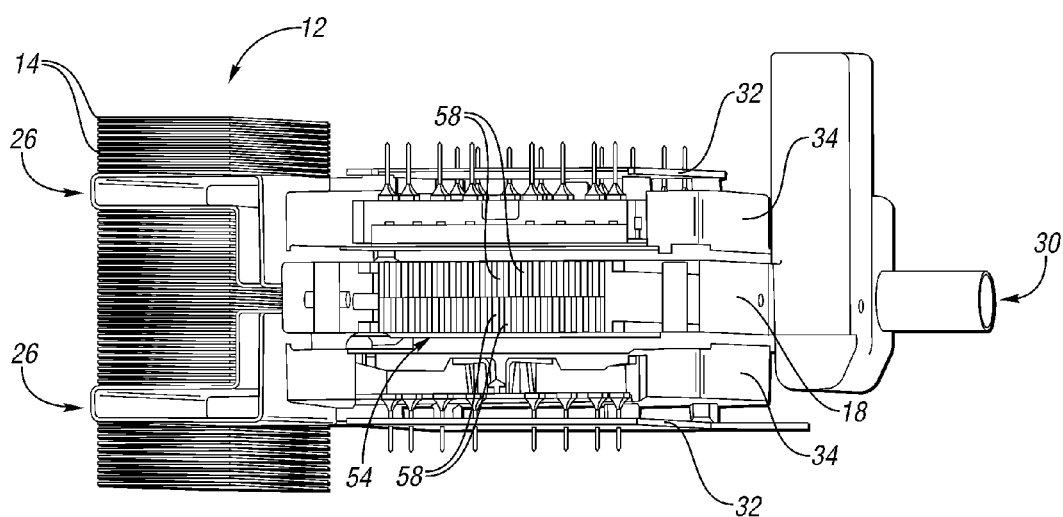
FIG. 5 is a cross-sectional view of the coldplate of FIG. 1A disclosed herein taken along the line 5-5 in FIG. 1A.

Referring next to FIGS. 4 and 5, cross-sectional views are shown of the coldplate (10) of FIG. 1A taken along the lines 4-4 and 5-5 in FIG. 1A. In particular, FIG. 4 depicts a cross-section of the conduit (24) formed by the second portion (22) of the coldplate (10), including the inlets (40, 42) to chambers (26) and the inlet (28). As seen in FIG. 5, the ring-shaped first portion (18) of the coldplate (10), together with the IGBT modules (34) attached to the top and bottom sides of the first portion (18) form a manifold or chamber (54). As seen in FIG. 4, the second portion (22) of the coldplate (10) also has an opening formed therein that serves as an inlet (56) to the chamber (54). A corresponding opening (not shown) formed on the opposite side of the second portion of the coldplate (10) serves as an outlet from the chamber (54). The IGBT modules (34) may also be provided with fins (58) configured to extend into the chamber (54).

With such a configuration, coolant may flow and/or circulate from the inlet (28) through the conduit (24) formed by the second portion (22) of the coldplate (10), including through inlet (56) into chamber (54), then out of chamber (54) through the corresponding outlet (not shown) formed in the second portion (22) of the coldplate (10) and on to the outlet (30). Such a configuration and coolant flow facilitates the dissipation of heat generated by the IGBT modules (34) and the PCBs (32) having electrical components attached thereto. In particular, such a flow of coolant within the chamber (54) allows for contact between the coolant and surface areas of the IGBT modules (34), which surface areas may be increased by the use of fins (58), to thereby provide cooling to the IGBT modules (34) and the PCBs (32) in contact with the IGBT modules (34). Such a configuration and coolant flow is described in greater detail in U.S. patent application Ser. No. 13/209,552, filed on Aug. 15, 2011, the disclosure of which is hereby incorporated in its entirety by reference herein.

As is readily apparent from the foregoing, a coldplate for use with an inverter in an EV or an HEV has been described. The embodiments of the coldplate described provide for additional heat dissipation beyond that which may be supplied by a standard coldplate used with an EV or HEV inverter. Such embodiments include a coldplate with a portion having a chamber configured to contact one or more of the film capacitors of the DC link capacitor in order to provide for additional dissipation of the heat generated by inverter operation, thereby providing for efficient operation of the inverter.

While various embodiments of a coldplete for use with an inverter in an EV or an HEV have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A coldplate for use with an inverter in an electric vehicle (EV) or a hybrid-electric vehicle (HEV), the inverter including a direct current (DC) link capacitor comprising a plurality of film capacitors, the coldplate comprising:
   a first portion configured for attachment to at least one electronic component, the first portion having a perimeter and for dissipating heat generated by the at least one electronic component; and
   a second portion configured to be oriented along the perimeter of the first portion and forming a conduit, the conduit having a chamber extending from the perimeter of the first portion and configured to be positioned between two of the plurality of film capacitors of the DC link capacitor, the conduit having an inlet and an outlet to facilitate circulation of a coolant through the chamber of the conduit for dissipating heat generated by the DC link capacitor.

2. The cold plate of claim 1 wherein the first portion has a substantially ring-like shape.

3. The coldplate of claim 1 wherein the perimeter of the first portion comprises four sides, and the second portion extends along three sides of the perimeter of the first portion.

4. The coldplate of claim 1 wherein the chamber of the conduit has a substantially plate-like shape.

5. The coldplate of claim 4 wherein the chamber is formed by a pair of substantially planar walls, each wall having an area configured for contact with a side of one of the plurality of film capacitors of the DC link capacitor.

6. The coldplate of claim 1 wherein the chamber is formed by a pair of substantially planar walls, each wall having an area configured for contact with a side of one of the plurality of film capacitors of the DC link capacitor.

7. The coldplate of claim 1 wherein the plurality of film capacitors of the DC link capacitor comprise a plurality of packs of film capacitors, and the chamber of the second portion is configured to be positioned between two of the plurality of packs of film capacitors.

8. The coldplate of claim 7 wherein the chamber is formed by a pair of substantially planar walls, each wall having an area configured for contact with a side of a film capacitor in a different one of the plurality of packs of film capacitors.

9. A heat sink for use with an inverter in an electric vehicle (EV) or a hybrid-electric vehicle (HEV), the inverter including a direct current (DC) link capacitor comprising a plurality of film capacitors, the heat sink comprising:
   a first portion configured for attachment to a printed circuit board (PCB) having at least one electronic component attached thereto, the first portion having a perimeter and for dissipating heat generated by the at least one electronic component; and
   a second portion configured to be oriented along the perimeter of the first portion and forming a conduit, the conduit having a plurality of chambers, each of the plurality of chambers extending from the perimeter of the first portion and configured to be positioned between two of the plurality of film capacitors of the DC link capacitor, the conduit having an inlet and an outlet to facilitate circulation of a coolant through the plurality of chambers of the conduit for dissipating heat generated by the DC link capacitor.

10. The heat sink of claim 9 wherein the first portion has a substantially plate-like shape.

11. The heat sink of claim 9 wherein the first portion has a substantially ring-like shape.

12. The heat sink of claim 9 wherein the perimeter of the first portion comprises four sides, and the second portion extends along three sides of the perimeter of the first portion.

13. The heat sink of claim 9 wherein each of the plurality of chambers of the conduit has a substantially plate-like shape.

14. The heat sink of claim 13 wherein each chamber is formed by a pair of substantially planar walls, each wall having an area configured for contact with a side of one of the plurality of film capacitors of the DC link capacitor.

15. The heat sink of claim 9 wherein each chamber is formed by a pair of substantially planar walls, each wall having an area configured for contact with a side of one of the plurality of film capacitors of the DC link capacitor.

16. The heat sink of claim 9 wherein the plurality of film capacitors of the DC link capacitor comprise a plurality of packs of film capacitors, and each chamber of the second portion is configured to be positioned between two of the plurality of packs of film capacitors.

17. The heat sink of claim 16 wherein each chamber is formed by a pair of substantially planar walls, each wall having an area configured for contact with a side of a film capacitor in a different one of the plurality of packs of film capacitors.

18. An inverter for use in an electric vehicle (EV) or a hybrid-electric vehicle (HEV), the inverter comprising:
   a direct current (DC) link capacitor comprising a plurality of film capacitors; and
   a heat sink comprising
      a first portion configured for attachment to at least one electronic component, the first portion having a perimeter and for dissipating heat generated by the at least one electronic component, and
      a second portion configured to be oriented along the perimeter of the first portion and forming a conduit, the conduit having a chamber extending from the perimeter of the first portion and configured to be positioned between two of the plurality of film capacitors of the DC link capacitor, the conduit having an inlet and an outlet to facilitate circulation of a coolant through the chamber of the conduit for dissipating heat generated by the DC link capacitor.

19. The inverter of claim 18 wherein the chamber of the conduit has a substantially plate-like shape.

20. The inverter of claim 18 wherein the chamber is formed by a pair of substantially planar walls, each wall having an area configured for contact with a side of one of the plurality of film capacitors of the DC link capacitor.

* * * * *